United States Patent
Chen et al.

(10) Patent No.: US 10,269,736 B2
(45) Date of Patent: Apr. 23, 2019

(54) METHOD OF FORMING METAL PADS WITH OPENINGS IN INTEGRATED CIRCUITS INCLUDING FORMING A POLYMER EXTENDING INTO A METAL PAD

(71) Applicant: Taiwan Semiconductor Manufacturing Company, Ltd., Hsinchu (TW)

(72) Inventors: Shuo-Mao Chen, New Taipei (TW); Yu-Ting Huang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 59 days.

(21) Appl. No.: 15/452,813

(22) Filed: Mar. 8, 2017

(65) Prior Publication Data

US 2017/0179052 A1    Jun. 22, 2017

Related U.S. Application Data

(63) Continuation of application No. 14/990,310, filed on Jan. 7, 2016, now Pat. No. 9,601,372, which is a
(Continued)

(51) Int. Cl.
*H01L 23/00* (2006.01)
*H01L 23/31* (2006.01)
(Continued)

(52) U.S. Cl.
CPC .............. *H01L 24/05* (2013.01); *H01L 21/56* (2013.01); *H01L 21/76805* (2013.01); *H01L 21/76831* (2013.01); *H01L 21/76871* (2013.01); *H01L 21/76883* (2013.01); *H01L 21/76897* (2013.01); *H01L 23/3114* (2013.01); *H01L 23/3128* (2013.01); *H01L 23/3185* (2013.01); *H01L 23/3192* (2013.01); *H01L 23/49811* (2013.01); *H01L 24/03* (2013.01); *H01L 24/13* (2013.01); *H01L 23/525* (2013.01); *H01L 2224/0235* (2013.01); *H01L 2224/02125* (2013.01); *H01L 2224/02331* (2013.01); *H01L 2224/02375* (2013.01); *H01L 2224/02381* (2013.01); *H01L 2224/0401* (2013.01); *H01L 2224/04105* (2013.01); *H01L 2224/05008* (2013.01);
(Continued)

(58) Field of Classification Search
None
See application file for complete search history.

(56) References Cited

U.S. PATENT DOCUMENTS

7,977,783 B1    7/2011    Park et al.
2005/0176233 A1    8/2005    Joshi et al.
(Continued)

*Primary Examiner* — Jay C Chang
(74) *Attorney, Agent, or Firm* — Slater Matsil, LLP (57) ABSTRACT

A device includes a metal pad, and a passivation layer comprising portions overlapping edge portions of the metal pad. The metal pad and the passivation layer are in a chip. A solder region is over the passivation layer. A metallic feature electrically inter-couples the metal pad and the solder region, and the metallic feature includes a continuous metal region. A polymer layer includes an upper portion over the metallic feature, and a lower portion penetrating through the continuous metal region.

20 Claims, 12 Drawing Sheets

Related U.S. Application Data continuation of application No. 13/764,569, filed on Feb. 11, 2013, now Pat. No. 9,245,833.

(60) Provisional application No. 61/695,206, filed on Aug. 30, 2012.

(51) Int. Cl.
*H01L 23/498* (2006.01)
*H01L 23/525* (2006.01)
*H01L 21/56* (2006.01)
*H01L 21/768* (2006.01)

(52) U.S. Cl.
CPC ............ *H01L 2224/05011* (2013.01); *H01L 2224/05012* (2013.01); *H01L 2224/05124* (2013.01); *H01L 2224/05147* (2013.01); *H01L 2224/05572* (2013.01); *H01L 2224/05599* (2013.01); *H01L 2224/12105* (2013.01); *H01L 2224/131* (2013.01); *H01L 2224/13021* (2013.01); *H01L 2224/13024* (2013.01); *H01L 2224/13082* (2013.01); *H01L 2224/13147* (2013.01); *H01L 2224/13155* (2013.01); *H01L 2924/00014* (2013.01); *H01L 2924/181* (2013.01)

(56) References Cited

U.S. PATENT DOCUMENTS

| | | | |
|---|---|---|---|
| 2006/0022354 A1 | 2/2006 | Anzai | |
| 2006/0252225 A1* | 11/2006 | Gambee | H01L 21/31133 438/400 |
| 2007/0176290 A1 | 8/2007 | Park et al. | |
| 2007/0284726 A1* | 12/2007 | Lin | H01L 23/525 257/698 |
| 2008/0038874 A1 | 2/2008 | Lin | |
| 2009/0302749 A1* | 12/2009 | Lee | B82Y 10/00 313/504 |
| 2010/0013082 A1* | 1/2010 | Lin | H01L 21/568 257/692 |
| 2011/0101312 A1 | 5/2011 | LeCloux et al. | |
| 2011/0156237 A1 | 6/2011 | Gulpen et al. | |

* cited by examiner

METHOD OF FORMING METAL PADS WITH OPENINGS IN INTEGRATED CIRCUITS INCLUDING FORMING A POLYMER EXTENDING INTO A METAL PAD

PRIORITY CLAIM AND CROSS-REFERENCE

This application is a continuation of U.S. patent Ser. No. 14/990,310, filed Jan. 7, 2016, and entitled "Method of Forming Metal Pads with Openings in Integrated Circuits Including Forming a Polymer Plug Extending into a Metal Pad," which application is a continuation of U.S. patent application Ser. No. 13/764,569, filed Feb. 11, 2013, and entitled "Metal Pads with Openings in Integrated Circuits," now U.S. Pat. No. 9,245,833, issued Jan. 26, 2016, which application claims the benefit of the following provisionally filed U.S. patent application: Application Ser. No. 61/695,206, filed Aug. 30, 2012, and entitled "Metal Pads with Openings in Integrated Circuits," which applications are hereby incorporated herein by reference.

BACKGROUND

In the formation of integrated circuits, devices such as transistors are first formed at the surface of a semiconductor substrate in a wafer. An interconnect structure is then formed over the integrated circuit devices. A metal pad is formed over, and is electrically coupled to, the interconnect structure. A passivation layer and a first polymer layer are formed on the metal pad, with the metal pad exposed through the openings in the passivation layer and the first polymer layer.

Post-passivation interconnect (PPI) is then formed, followed by the formation of a second polymer layer over the PPI. An Under-Bump-Metallurgy (UBM) is formed extending into an opening in the second polymer layer, wherein the UBM is electrically connected to the PPI. A solder ball is then placed over the UBM and reflowed.

A PPI may include a PPI pad, over which a UBM is formed. Furthermore, the PPI may include a PPI trace that connects the PPI pad to the underlying metal pad.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A package comprising a Post-Passivation Interconnect (PPI) structure and the method of forming the same are provided in accordance with some embodiments. The intermediate stages of manufacturing the package in accordance with some embodiments are illustrated. The variations of the embodiments are discussed. Throughout the various views and illustrative embodiments, like reference numbers are used to designate like elements.

Figure 1:
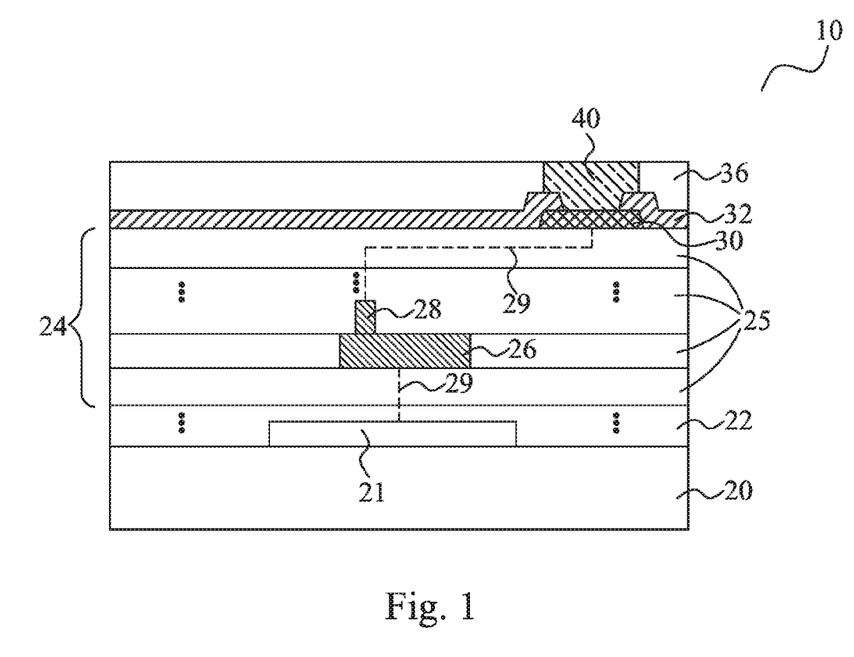
FIGS. 1 through 8B are cross-sectional views of intermediate stages in the manufacturing of a package in accordance with some exemplary embodiments.

Referring to FIG. 1, chip 10, which includes semiconductor substrate 20, is provided. Semiconductor substrate 20 may be a bulk silicon substrate or a silicon-on-insulator substrate. Alternatively, other semiconductor materials that include group III, group IV, and/or group V elements may also be used, which semiconductor materials may include silicon germanium, silicon carbon, and III-V compound semiconductor materials. Integrated circuit devices such as transistors (schematically illustrated as 21) are formed in and/or on semiconductor substrate 20. Chip 10 may further include Inter-Layer Dielectric (ILD) 22 over semiconductor substrate 20, and interconnect structure 24 over ILD 22. Interconnect structure 24 includes metal lines 26 and vias 28, which are formed in dielectric layers 25. The combination of metal lines at a same level is referred to a metal layer hereinafter. In some embodiments, interconnect structure 24 includes a plurality of metal layers that are interconnected through vias 28. Metal lines 26 and vias 28 may be formed of copper or copper alloys, although they can also be formed of other metals. In some embodiments, dielectric layers 25 are formed of low-k dielectric materials. The dielectric constants (k values) of the low-k dielectric materials may be less than about 3.0, or less than about 2.5, for example.

Metal pad 30 is formed over interconnect structure 24, and may be electrically coupled to integrated circuit devices 21 through metal lines 26 and vias 28, wherein lines 29 are illustrated to represent the electrical coupling. Metal pad 30 may be an aluminum pad or an aluminum-copper pad, although other metallic materials may be used. Passivation layer 32 is formed over interconnect structure 24. A portion of passivation layer 32 may cover the edge portions of metal pad 30, and a central portion of metal pad 30 is exposed through an opening in passivation layer 32. Passivation layer 32 may be a single layer or a composite layer, and may be formed of a non-porous material. In some embodiments, passivation layer 32 is a composite layer comprising a silicon oxide layer (not shown), and a silicon nitride layer (not shown) over the silicon oxide layer. Passivation layer 32 may also be formed of other non-porous dielectric materials such as Un-doped Silicate Glass (USG), silicon oxynitride, and/or the like.

Polymer layer 36 is formed over passivation layer 32. Polymer layer 36 may comprise a polymer such as polyimide, BenzoCycloButene (BCB), PolyBenzOxazole (PBO), and the like. The formation methods may include spin coating, for example. Polymer layer 36 may be dispensed in a liquid form, and then cured.

Polymer layer 36 is patterned, and metal via 40 is formed in polymer layer 36. Metal via 40 may overlap and contact the top surface of metal pad 30. Metal via 40 may also include portions extending over and contacting portions of passivation layer 32 in accordance with some embodiments. The top surface of metal via 40 may be level with the top surface of polymer layer 36.

Figure 2:
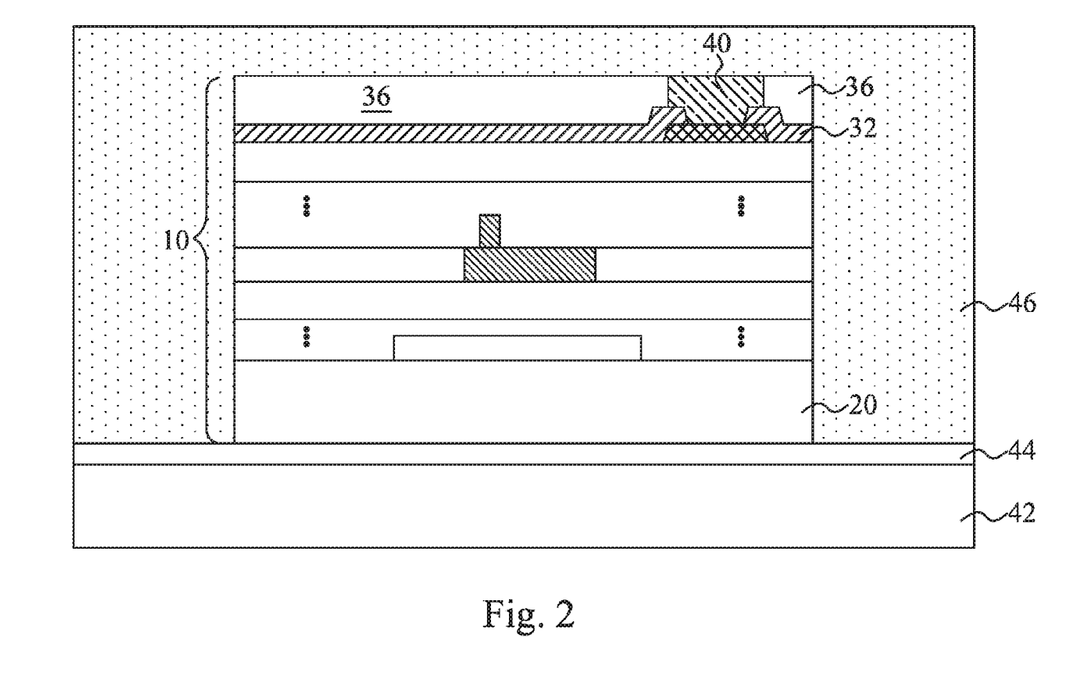
Figure 3:
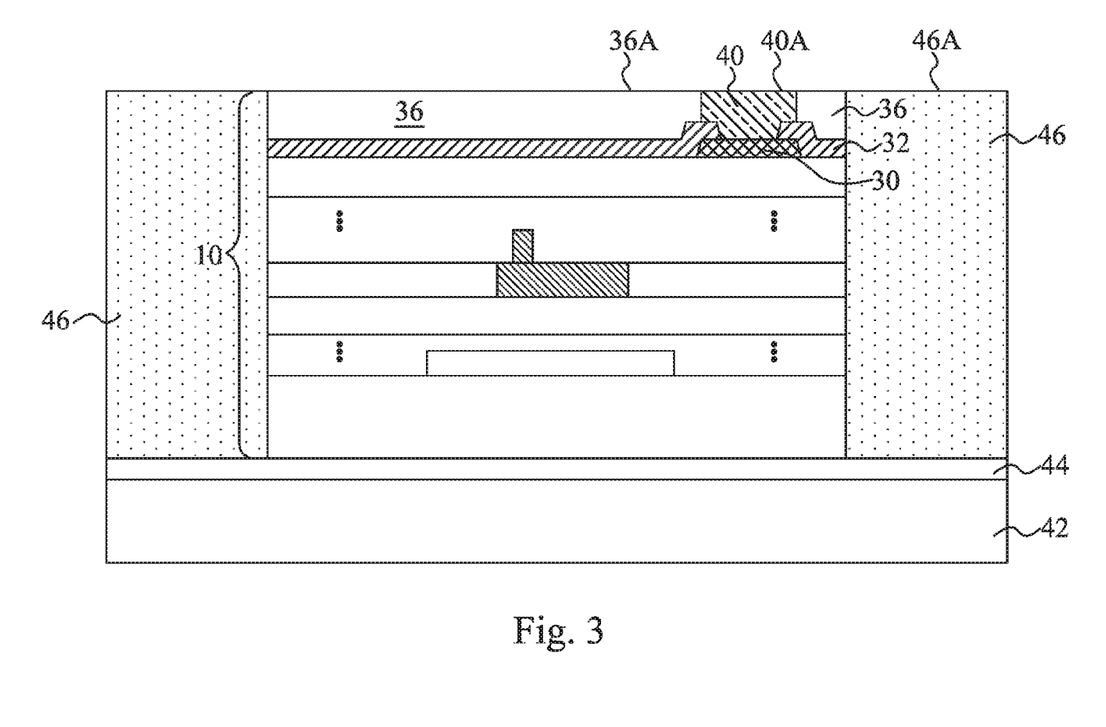

Next, referring to FIG. 2, chip 10 is placed on carrier 42, for example, through adhesive 44. Molding material 46 is then dispensed and cured to mold chip 10 therein. In some embodiments, molding material 46 comprises a molding compound. In alternative embodiments, molding material 46 comprises a molding underfill, a resin, or the like. Next, referring to FIG. 3, a planarization is performed to remove excess portions of molding material 46 over polymer layer 36 and metal via 40 to reveal metal via 40. As a result, top surface 36A of polymer layer 36, top surface 46A of molding material 46, and top surface 40A of metal via 40 are substantially level with each other.

Figure 4:
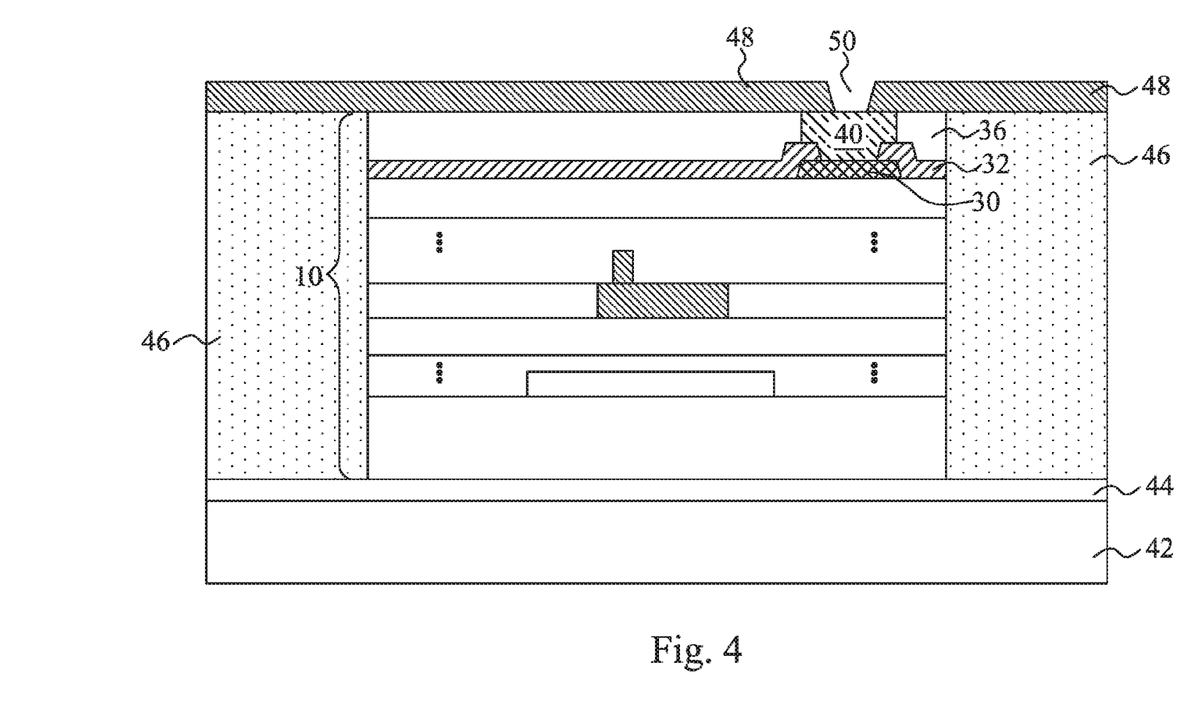

In FIG. 4, polymer layer 48 is formed, which may comprise a polymer selected from the same group of candidate materials as polymer layer 36. Polymer layer 48 thus extends overlapping, and in contact with, polymer layer 36, metal via 40, and molding material 46. Polymer layer 48 is then patterned to form opening 50, through which metal via 40 is exposed. In the embodiments that polymer layer 48 is formed of a photo-sensitive material, polymer layer 48 is patterned by exposing to light through a lithography mask (not shown). The exposed polymer layer 48 is then developed to form opening 50.

Figure 5:
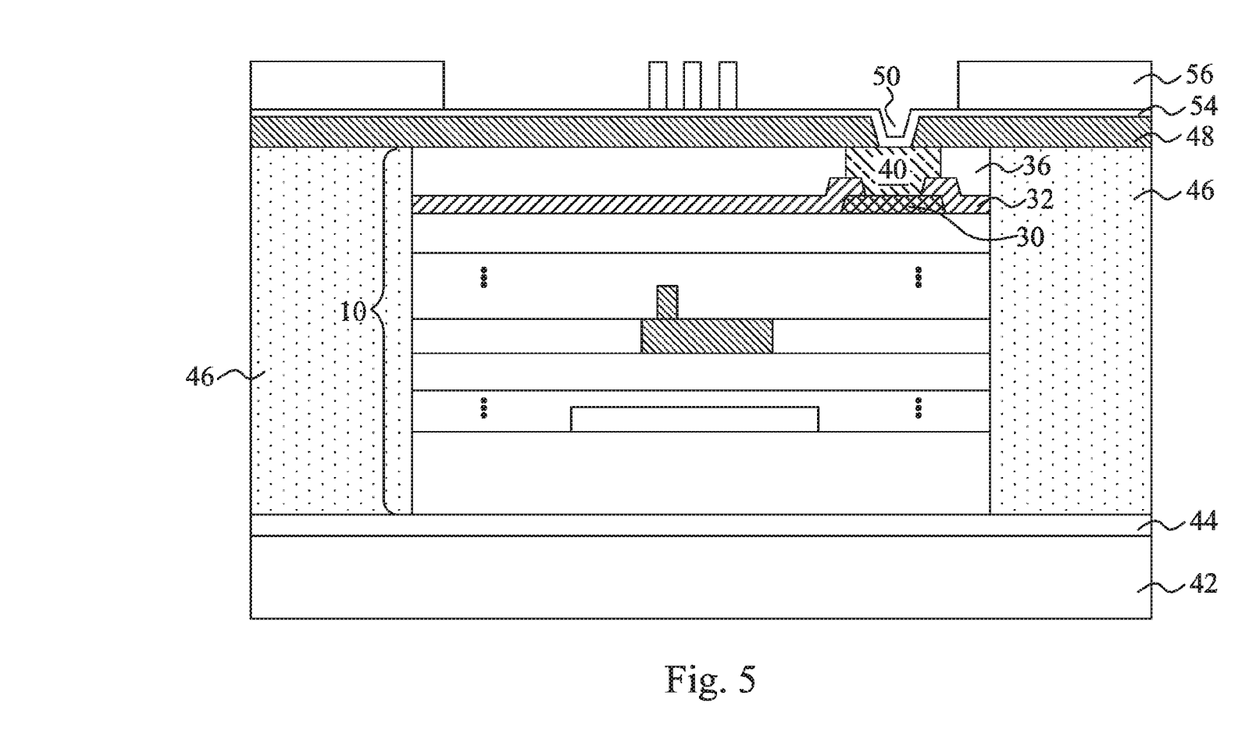
Figure 6:
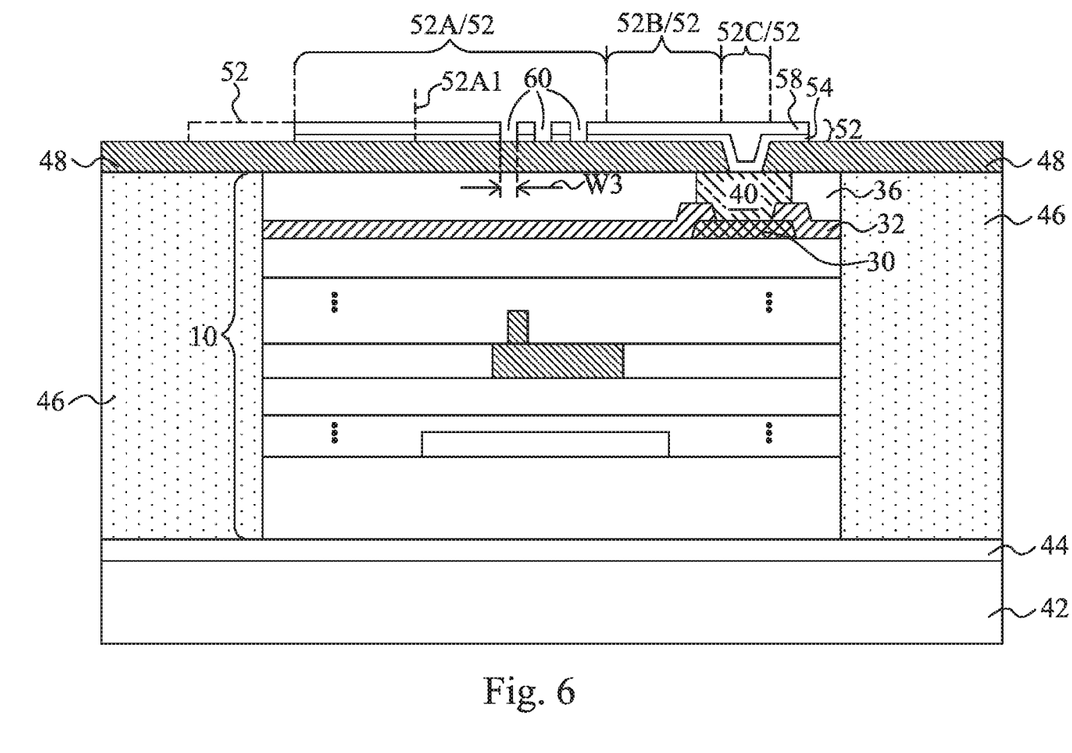

FIGS. 5 and 6 illustrate the formation of PPI 52, which is such named since the formation of PPI 52 is after the formation of passivation layer 32. In some embodiments, as shown in FIG. 5, Seed layer 54 is deposited over polymer layer 48, followed by the formation and the patterning of mask 56 over seed layer 54. Seed layer 54 may be a copper layer deposited using Physical Vapor Deposition (PVD), for example. Mask layer 56 may be a dry film or a photo resist. Metal layer 58 is then formed over seed layer 54, as shown in FIG. 6. Metal layer 58 may be formed of pure copper, substantially pure copper, or a copper alloy, and may be formed using plating. After the formation of metal layer 58, mask layer 56 (FIG. 5) is removed. The portions of seed layer 54 overlapped by mask layer 56 are then removed in an etching step. Resulting in the pattern shown in FIG. 6. The remaining portions of seed layer 54 and metal layer 58 are in combination referred to as PPI 52 hereinafter.

Figure 9A:
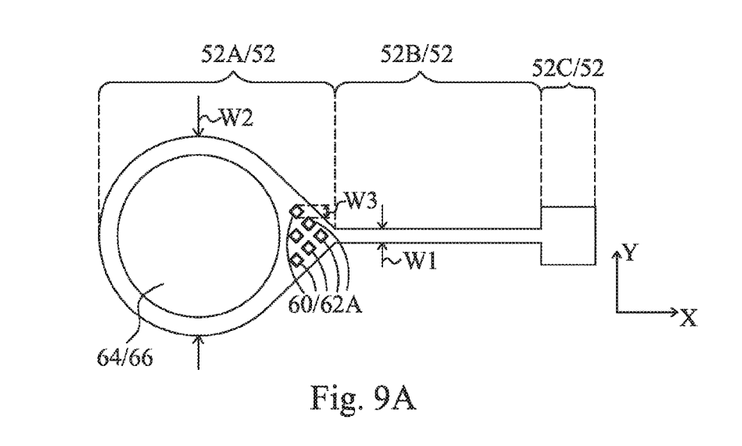
FIGS. 9A through 9E illustrate the top views of portions of the package, wherein Under-Bump-Metallurgies (UBMs) and holes in Post-Passivation Interconnect (PPI) structure are illustrated.

PPI 52 includes PPI pad 52A and PPI trace 52B. The lateral dimension (such as width or diameter) of PPI pad 52A is significantly greater than the lateral dimension of PPI trace 52B. For example, FIG. 9A illustrates a top view of exemplary PPI 52. In the embodiments in FIG. 9A, PPI trace 52B has a longitudinal direction in X direction, wherein dimension W2 of PPI pad 52A is greater than three times, five times, or ten times width W1 of PPI trace 52B, wherein widths W1 and W2 are measured in Y direction. In some embodiments, width W1 of PPI trace 52B is substantially uniform.

Referring back to FIG. 6, PPI 52 further includes via portion 52C that extends into opening 50 (FIG. 4) of polymer layer 48 to contact metal via 40. In some embodiments, PPI 52 may extend to overlap chip 10 and molding material 46, as illustrated by dashed lines. Accordingly, the illustrated structure may be a fan-out structure.

As also shown in FIG. 6, PPI 52 may include one or a plurality of openings 60 in PPI pad 52A, wherein openings 60 may be in the transition region of PPI pad 52A and PPI trace 52B. Polymer layer 48 is exposed through openings 60. In some embodiments, no openings 60 are formed in regions other than the transition region. For example, in the portions of PPI pad 52A close to the center 52A1 of PPI pad 52A, no opening is formed. Also, there may not be any opening(s) formed on the portions of PPI pad 52A that are on the opposite side of center 52A1 than PPI trace 52B. Width W3 of openings 60 may be between about 20 percent and about 80 percent of width W1 of PPI trace 52B. It is appreciated, however, that the dimensions recited throughout the description are merely examples, and may be changed to different values.

Figure 7:
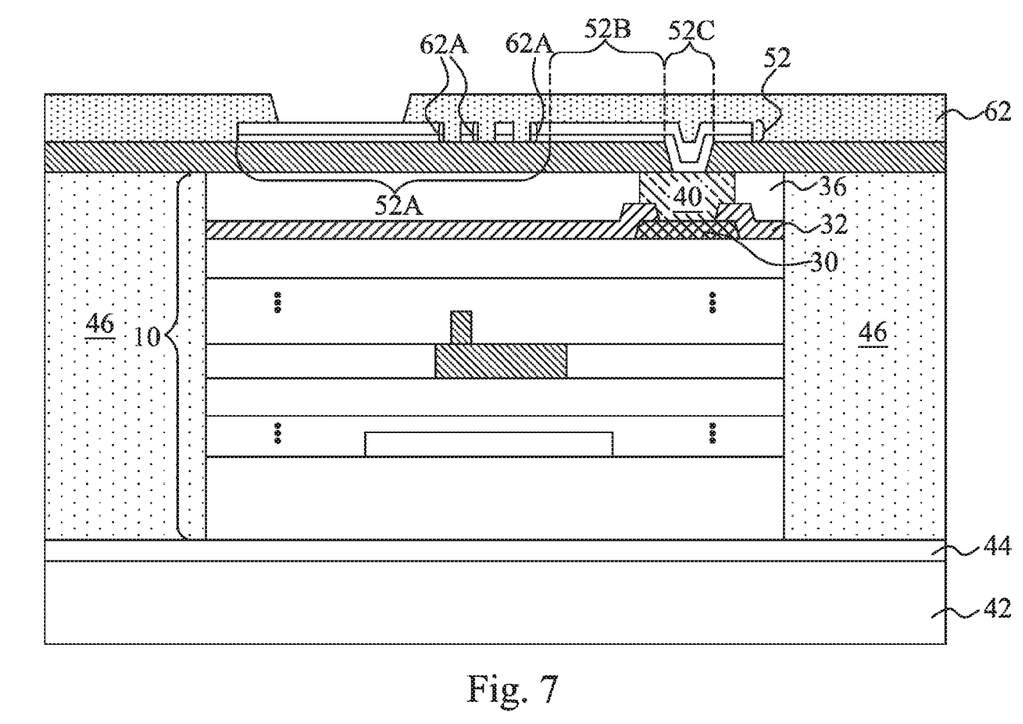

FIG. 7 illustrates the formation and the patterning of polymer layer 62. Polymer layer 62 may comprise polyimide or another polymer-based material such as PBO, BCB, or the like. In some embodiments, polymer layer 62 is formed using spin coating. Polymer layer 62 comprises portions filled into openings 60 (FIG. 6), which portions of polymer layer 62 are referred to as polymer plugs 62A throughout the description. Furthermore, polymer layer 62 further comprises a portion overlapping PPI 52, and portions encircling PPI 52.

Figure 8:
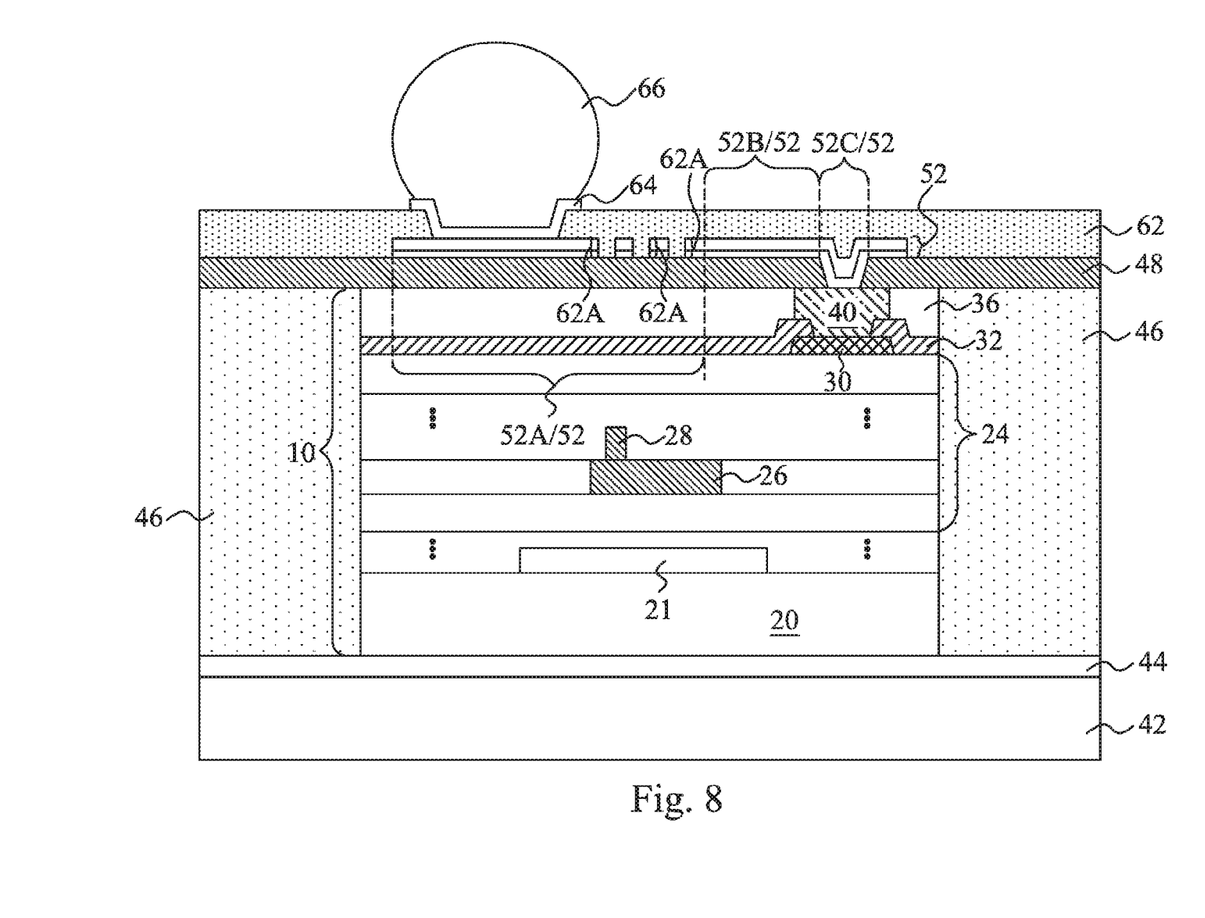
Figure 8A:
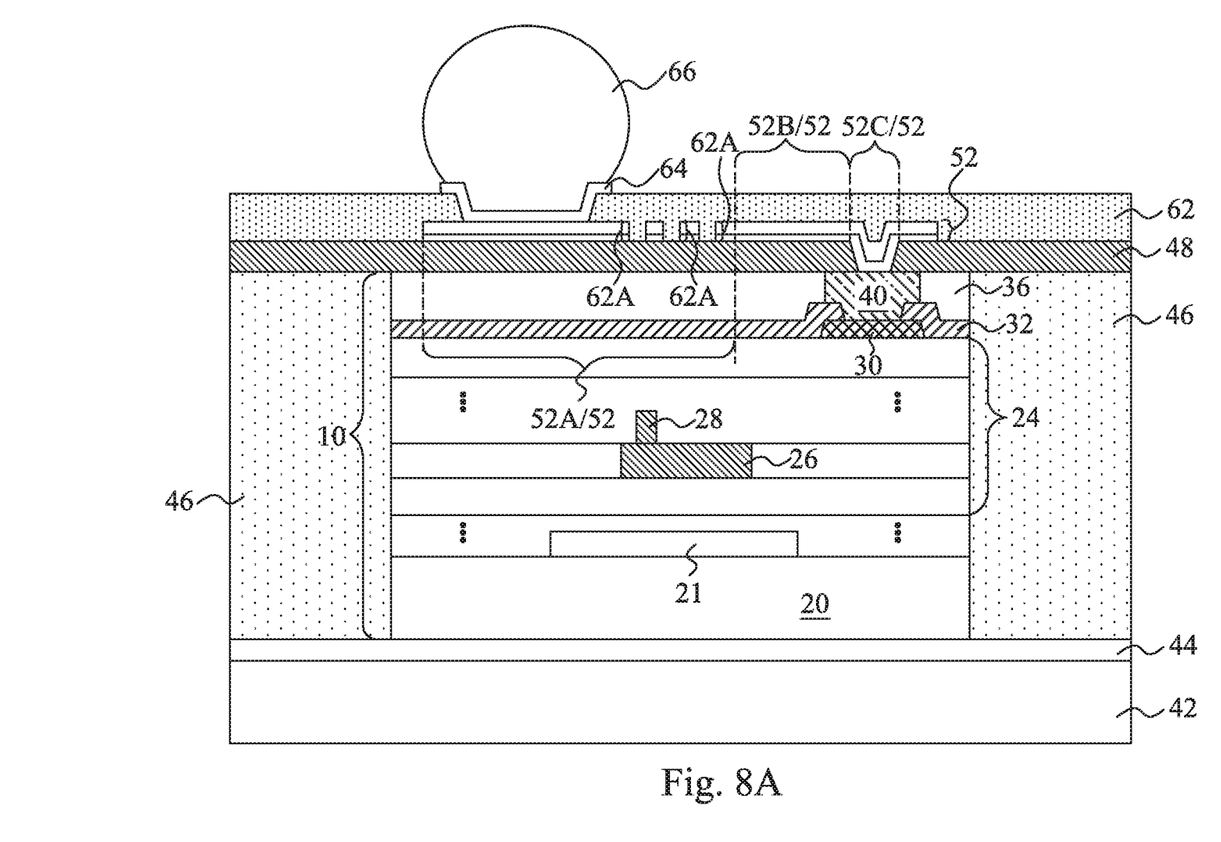

Next, as shown in FIG. 8A, UBM layer 64 is formed. In some embodiments, UBM layer 64 includes a barrier layer (not shown) and seed layer (not shown) over the barrier layer. UBM layer 64 extends into the opening in polymer layer 62, and may further include portions overlapping polymer layer 62. UBM layer 64 may be electrically coupled to, and may be in physical contact with, PPI pad 52A. The barrier layer may be a titanium layer, a titanium nitride layer, a tantalum layer, a tantalum nitride layer, or layers formed of a titanium alloy or a tantalum alloy. The materials of the seed layer may include copper or copper alloys. In some embodiments, UBM layer 64 is formed using PVD or other applicable methods.

Further referring to FIG. 8A, connector 66 is formed. In some embodiments, connector 66 is a metal region, which is either a metal ball, such as a solder ball or a copper ball, placed on UBM layer 64, or a metal pillar formed on UBM layer 64 through plating. In the embodiments wherein connector 66 comprises solder, the solder may go through a reflow process, and metal ball 66 is formed. In alternative embodiments, connector 66 comprises a metal pillar, which may be a copper pillar. Additional layers such as a nickel layer, a solder cap, a palladium layer, and the like, may also be formed on the metal pillar. Chip 10 and molding material may then be demounted from carrier 42 as an integrated package.

Figure 8B:
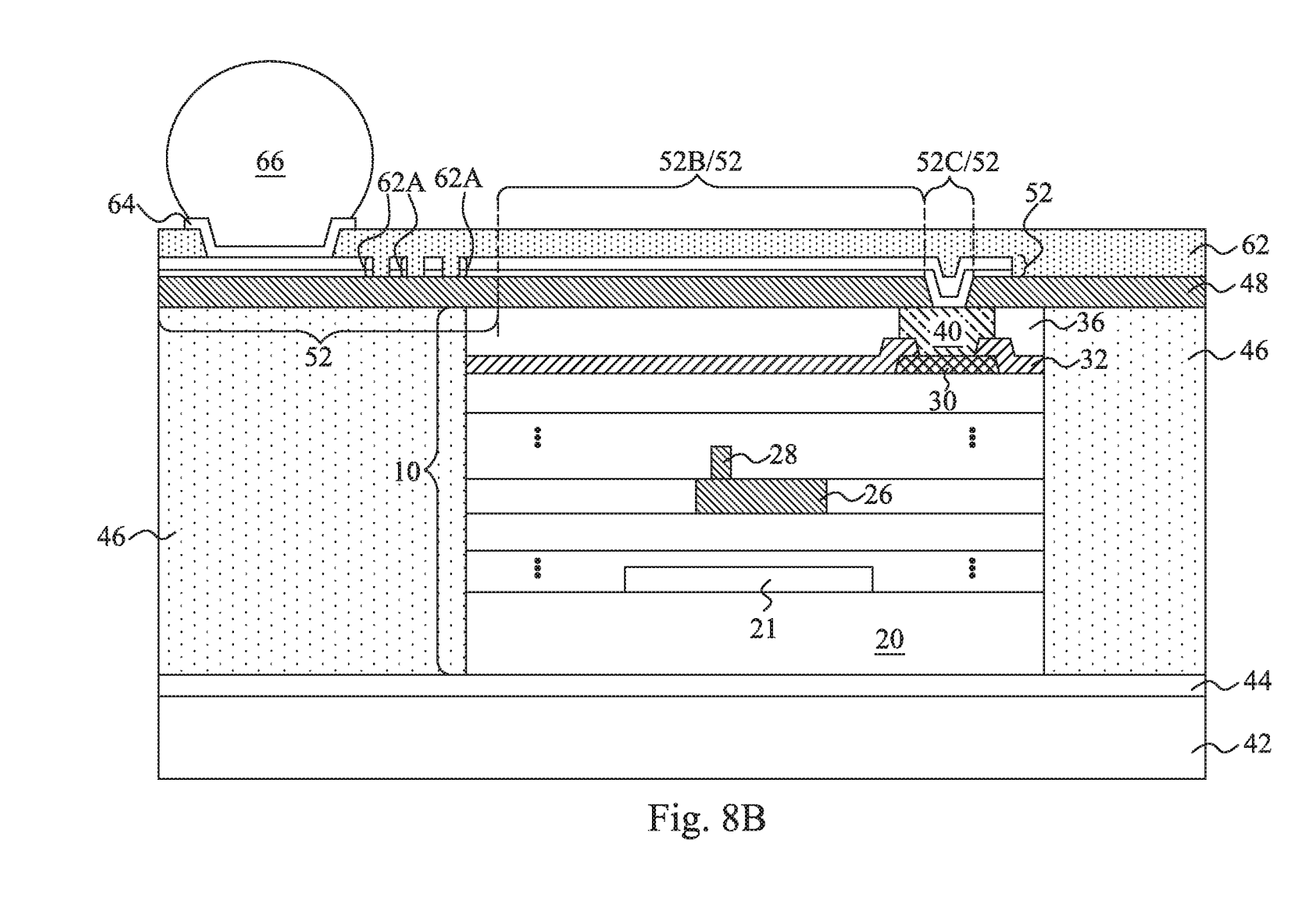

FIG. 8B illustrates the cross-sectional view of a package in accordance with alternative embodiments. These embodiments are similar to the embodiments shown in FIG. 8A, except that PPI pad 52A is in the fan-out region of the respective package. PPI pad 52A hence overlaps molding material 46. In additional, polymer plugs 62A may also be in the fan-out region and overlap molding material 46, as shown in FIG. 8B. In alternative embodiments, PPI pad 52A overlaps molding material 46, while a part (and not all) of polymer plugs 62A overlaps molding material 46, and the remaining polymer plugs 62A overlap chip 10.

FIGS. 9A through 9E illustrate top views of exemplary PPI traces 52B, UBMs 64, and metal connectors 66. In each of FIGS. 9A through 9E, openings 60 are formed in PPI pad 52A, and polymer plugs 62A are filled in openings 60. Openings 60/polymer plugs 62A are formed in the transition regions of PPI pad 52A, which transition region is close to PPI trace 52B. For example, the transition regions are where the widths gradually reduce from the width of PPI pads 52A to the width of corresponding connecting PPI traces 52B. In the top views in FIGS. 9A through 9E, PPI pads 52A may have circular shapes, wherein the diameter of the circle is also shown as width W2, although PPI pads 52 may have other shapes such as ellipse, hexagon, rectangle, or the like. The openings 60/polymer plugs 62A having different counts, layouts, sizes are contemplated in the scope of the present disclosure. Furthermore, openings 60/polymer plugs 62A in FIGS. 9A through 9E may be combined, and formed in a same PPI 52 in any combination.

For example, FIG. 9A illustrates openings 60/polymer plugs 62A with diamond shapes or rectangular shapes. In some embodiments, width W3 of openings 60/polymer plugs 62A in FIG. 9A may be between about 20 percent and about 80 percent of width W1 of PPI trace 52B, and may be between about 20 percent and about 80 percent of width W2 of PPI pad 52A. Openings 60/polymer plugs 62A may be laid out as a plurality of columns, which may be either in the X direction and the Y direction. Each column of openings 60/polymer plugs 62A may be aligned to a space between two of the openings 60/polymer plugs 62A in the neighboring column.

Figure 9B:
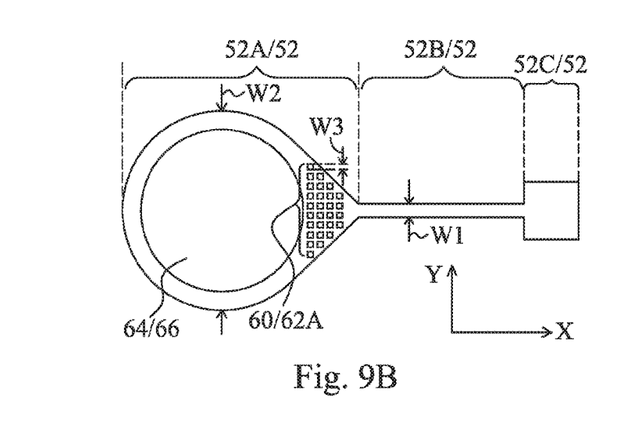

FIG. 9B illustrates more openings 60/polymer plugs 62A wither widths W3 smaller than in FIG. 9A. In some embodiments, width W3 in FIG. 9B may be between about 20 percent and about 80 percent of width W1 of PPI trace 52B, and may be between about 20 percent and about 80 percent of width W2 of PPI pad 52A. Again, openings 60/polymer plugs 62A in these embodiments may have a diamond shape, a rectangular shape, or a polygon shape. The openings 60/polymer plugs 62A may be laid out as a plurality of columns, which may extend either in the X direction or the Y direction. Each column and row of openings 60/polymer plugs 62A may be aligned to the openings 60/polymer plugs 62A in the neighboring row and column, respectively.

Figure 9C:
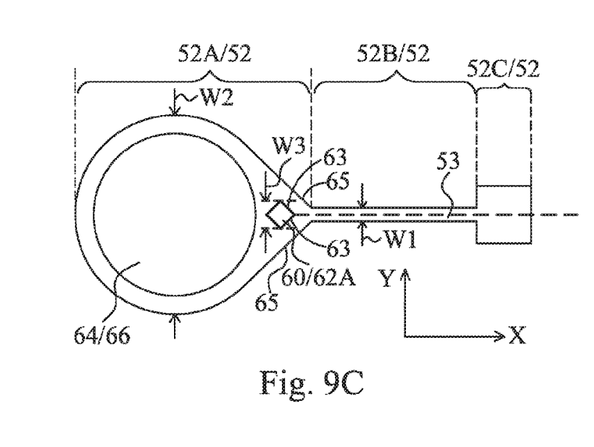

FIG. 9C illustrates a single opening 60/polymer plug 62A with a great size. In some embodiments, width W3 in FIG. 9C may be between about 20 percent and about 80 percent of width W1, and may be between about 20 percent and about 80 percent of width W2. The single opening 60/polymer plug 62A may be allocated to be aligned to center line 53 of PPI trace 52B, although opening 60/polymer plug 62A may also be misaligned from center line 53. Furthermore, edges 63 of the single opening 60/polymer plug 62A may be substantially parallel to edges 65 of the transition region of PPI 52.

Figure 9D:
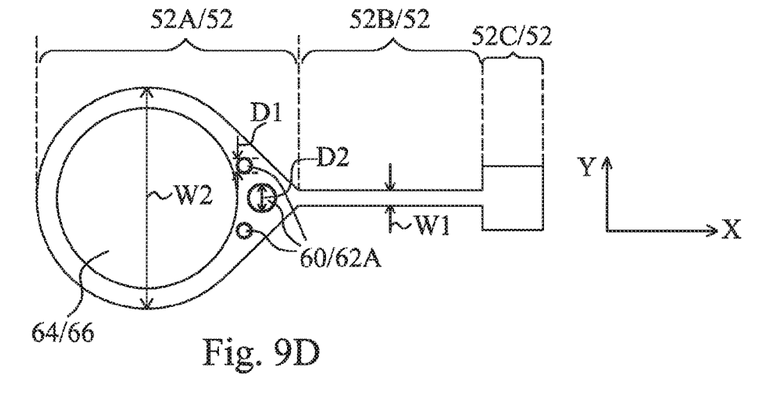

In FIG. 9D, openings 60/polymer plugs 62A have circular top-view shapes. In some embodiments, diameter D1 and/or D2 in FIG. 9D may be between about 20 percent and about 80 percent of width W1, and may be between about 20 percent and about 80 percent of width W2. Furthermore, openings 60/polymer plugs 62A may have diameters D1 and D2 that are different from each other. For example, a ratio of D2/D1 may be between about 0.2 and about 0.8 in accordance with some exemplary embodiments.

Figure 9E:
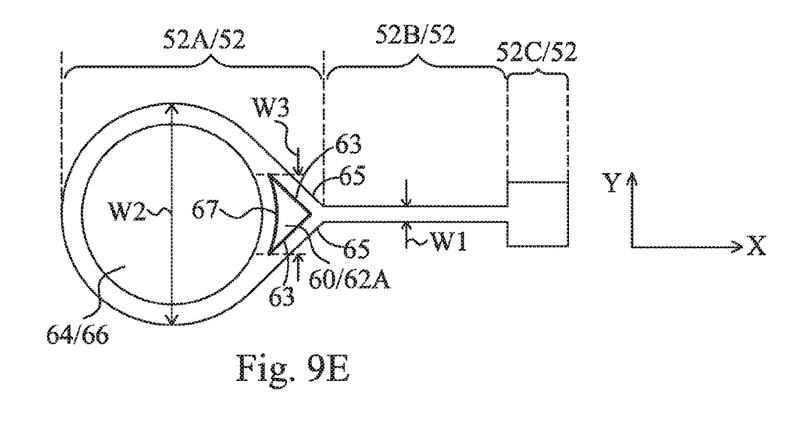

The top-view shapes of openings 60/polymer plugs 62A may be any shape including, and not limited to, rectangles or spades (FIGS. 9A through 9C), and circles (FIG. 9D). For example, FIG. 9E illustrates an irregular-shaped opening 60/polymer plug 62A, which have straight edges 63, and curved edge 67. Furthermore, edges 63 of the opening 60/polymer plug 62A may be substantially parallel to edges 65 of the transition region of PPI 52.

In some embodiments, openings 60/polymer plugs 62A are not overlapped by UBM 64 and/or connectors 66. In alternative embodiments, openings 60/polymer plugs 62A may be overlapped by (and hence are directly under) UBM 64 and/or connectors 66. In the illustrative embodiments, openings 60/polymer plugs 62A are formed in fan-out structures, in which PPI 52 may extend beyond the edges of chip 10 to overlap molding material 46. In alternative embodiments, openings 60/polymer plugs 62A may be formed inside chip 10. In which case, metal via 40 and polymer layer 36 may not be formed, and PPI portion 52C as in FIGS. 8A and 8B extends into the opening in polymer layer 48 and passivation layer 32 to contact metal pad 30. In these embodiments, no molding material 46 is dispensed.

In the embodiments, by forming openings in the transitions region of a PPI pad, which transition region is close to a respective connecting PPI trace, the volume of the PPI in the transition region becomes smaller, and the transition region becomes more flexible and less rigid. Since PPI pads are much larger, and hence are much more rigid than PPI traces, the PPI traces suffer from stresses and may crack. By making transition regions less rigid, the transition regions may help absorb the stress, and hence PPI traces are protected from the crack.

In accordance with embodiments, a device includes a metal pad, and a passivation layer including portions overlapping edge portions of the metal pad. A PPI includes a trace portion overlying the passivation layer, and a pad portion connected to the trace portion. A polymer layer includes an upper portion over the PPI, and a plug portion extending into, and encircled by, the pad portion of the PPI.

In accordance with other embodiments, a chip includes a metal pad, a passivation layer comprising portions overlapping edge portions of the metal pad, and a first polymer layer over the metal pad. A molding material encircles the chip. A top surface of the molding material is substantially level with a top surface of the first polymer layer. A PPI is electrically coupled to the metal pad. The PPI includes a trace portion overlying the first polymer layer, and a pad portion overlying the first polymer layer and connected to the trace portion. A second polymer layer includes a cover portion over the PPI, and a plug portion penetrating through the pad portion of the PPI to contact the first polymer layer. A UBM extends into the second polymer layer to contact the pad portion of the PPI.

In accordance with yet other embodiments, a device includes a metal pad, a passivation layer including portions overlapping edge portions of the metal pad, a first polymer layer over the metal pad, and a metal via in the first polymer layer. The metal via overlaps, and is in contact with, the metal pad. A second polymer layer is disposed over the first polymer layer and the metal via. A PPI includes a first portion overlying the second polymer layer, and a second portion extending into the second polymer layer to contact the metal via. A third polymer layer includes a plug portion extending into, and encircled by, the PPI, wherein the plug portion comprises a bottom surface contacting a top surface of the second polymer layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a metal pad;
   a passivation layer comprising portions overlapping edge portions of the metal pad, wherein the metal pad and the passivation layer are comprised in a chip;

a solder region over the passivation layer;
a metallic feature electrically inter-coupling the metal pad and the solder region, the metallic feature comprising a continuous metal region; and
a first polymer layer comprising:
an upper portion over the metallic feature; and
a lower portion penetrating through the continuous metal region, wherein the lower portion of the first polymer layer has a sidewall forming an interface with the metallic feature, and the interface forms a full ring having no break in a top view of the device.

2. The device of claim 1, further comprising a second polymer layer between the passivation layer and the first polymer layer, wherein the lower portion of the first polymer layer has a bottom surface contacting a top surface of the second polymer layer.

3. The device of claim 1, wherein the continuous metal region comprises:
a round portion having a first width;
a trace portion having a second width smaller than the first width; and
a bird-beak portion connecting the round portion to the trace portion, wherein the bird-beak portion has widths transitioning from the first width to the second width, and the lower portion of the first polymer layer is in the bird-beak portion.

4. The device of claim 1, wherein the device further comprises:
an encapsulating material encircling the chip, wherein the first polymer layer overlaps both the chip and the encapsulating material.

5. The device of claim 4, wherein the encapsulating material comprises a molding compound.

6. The device of claim 1, further comprising:
a plurality of discrete openings penetrating through the continuous metal region, wherein the plurality of discrete openings is separated from each other by the continuous metal region, and the first polymer layer further fills the plurality of discrete openings.

7. The device of claim 1, further comprising:
an Under-Bump Metallurgy (UBM) over and contacting the continuous metal region, wherein the solder region is over and contacting the UBM, and the lower portion of the first polymer layer is vertically misaligned from the solder region.

8. A device comprising:
a chip comprising:
a metal pad; and
a passivation layer comprising portions overlapping edge portions of the metal pad;
a first polymer layer over the chip;
a metallic feature comprising:
a first portion extending into the first polymer layer to electrically couple to the metal pad; and
a second portion overlying and in contact with a top surface of the first polymer layer;
a second polymer layer comprising:
a cover portion over the metallic feature; and
a plug portion penetrating through the second portion of the metallic feature to contact the first polymer layer;
a third polymer layer in the chip; and
a metal via in the third polymer layer and overlying the metal pad, with a top surface of the metal via and a top surface of the third polymer layer being in contact with a bottom surface of the first polymer layer.

9. The device of claim 8, further comprising an encapsulating material encircling the chip, wherein the bottom surface of the first polymer layer contacts both the chip and the encapsulating material.

10. The device of claim 8, wherein the plug portion of the second polymer layer is in a transition portion of the metallic feature, and wherein the transition portion has continuously reducing widths.

11. The device of claim 8, wherein the plug portion extends from a top surface of the second portion of the metallic feature to a bottom surface of the second portion of the metallic feature.

12. The device of claim 8, further comprising a plurality of discrete openings penetrating through the metallic feature, wherein the plurality of discrete openings is separated from each other by the metallic feature, and wherein the second polymer layer further fills the plurality of discrete openings.

13. The device of claim 8, wherein the plug portion of the second polymer layer forms an interface with the first polymer layer, and the interface is substantially coplanar with a bottom surface of the metallic feature.

14. A device comprising:
a metal pad;
a first polymer layer over the metal pad;
a metal via in the first polymer layer, wherein the metal via overlaps, and is in contact with, the metal pad;
a second polymer layer over the first polymer layer and the metal via; and
a Post-Passivation-Interconnect (PPI) comprising:
a pad portion having a circular top-view shape;
a trace portion narrower than the pad portion in a direction perpendicular to a lengthwise direction of the trace portion; and
a transition portion connecting the pad portion to the trace portion, with the transition portion being narrower from portions closer to the pad portion to portions closer to the trace portion, wherein the transition portion has a first width smaller than a second width of the pad portion, with both the first width and the second width measured in the direction perpendicular to the lengthwise direction of the trace portion, and wherein the pad portion, the trace portion and the transition portion are over and contacting the second polymer layer; and
a third polymer layer comprising a plug portion extending into, and fully encircled by, the transition portion of the PPI, wherein the plug portion comprises a bottom surface directly contacting a top surface of the second polymer layer.

15. The device of claim 14, further comprising a molding compound encircling and contacting sidewalls of the first polymer layer, wherein a bottom surface of the second polymer layer contacts both the molding compound and the first polymer layer.

16. The device of claim 15, wherein top surfaces of the molding compound and the first polymer layer, and the metal pad are substantially coplanar.

17. The device of claim 14, further comprising:
an Under-Bump-Metallurgy (UBM) over and physically contacting the pad portion of the PPI; and
a solder region overlying the UBM.

18. The device of claim 17, wherein the plug portion is misaligned with the UBM.

19. The device of claim 14, wherein the pad portion of the PPI has a circular shape, and a diameter of the pad portion is greater than a width of the trace portion, with the width of the trace portion measured in the direction perpendicular to the lengthwise direction of the trace portion.

20. The device of claim 14 further comprising a plurality of additional plug portions extending into, and fully encircled by, the transition portion of the PPI, wherein the plurality of additional plug portions are in physical contact with the top surface of the second polymer layer.

* * * * *